(12) United States Patent
Li et al.

(10) Patent No.: US 7,656,085 B2
(45) Date of Patent: Feb. 2, 2010

(54) SYSTEM AND METHOD FOR DIFFERENTIATING PICTURES AND TEXTS

(75) Inventors: Shi-Hao Li, Panchiao (TW); Tze-Chien Tsai, Taipei Hsien (TW)

(73) Assignee: AU Optronics Corp., Hsinchu (TW)

( * ) Notice: Subject to any disclaimer, the term of this patent is extended or adjusted under 35 U.S.C. 154(b) by 614 days.

(21) Appl. No.: 11/378,486

(22) Filed: Mar. 20, 2006

(65) Prior Publication Data
US 2006/0279205 A1    Dec. 14, 2006

(30) Foreign Application Priority Data
Jun. 10, 2005    (TW)    .............................. 94119354 A

(51) Int. Cl.
*H05B 33/00*    (2006.01)
(52) U.S. Cl. .................... 313/504; 313/506; 313/112; 313/113; 313/503
(58) Field of Classification Search .................. None
See application file for complete search history.

(56) References Cited

U.S. PATENT DOCUMENTS

| | | | | |
|---|---|---|---|---|
| 2004/0227698 A1* | 11/2004 | Yamazaki et al. | ............. | 345/32 |
| 2004/0245531 A1* | 12/2004 | Fuii et al. | ...................... | 257/88 |
| 2005/0040753 A1* | 2/2005 | Osame et al. | ............... | 313/500 |

FOREIGN PATENT DOCUMENTS

| | | |
|---|---|---|
| TW | 494584 B | 7/2002 |
| TW | 595245 B | 6/2004 |
| TW | 225627 B | 12/2004 |
| TW | 200512687 | 4/2005 |

* cited by examiner

*Primary Examiner*—Ashok Patel
(74) *Attorney, Agent, or Firm*—Birch, Stewart, Kolasch & Birch, LLP

(57) ABSTRACT

A dual emitting device includes a transparent substrate and an array of pixels. The array of pixels is disposed on the transparent substrate, and each pixel of the array includes at least one first sub-pixel and at least one second sub-pixel. The first sub-pixel includes a first OLED driven by a first TFT, and a first sheltering layer on the first OLED. The second sub-pixel includes a second OLED driven by a second TFT, and a second sheltering layer formed between the transparent substrate and the second OLED.

21 Claims, 7 Drawing Sheets

SYSTEM AND METHOD FOR DIFFERENTIATING PICTURES AND TEXTS

This application claims the benefit of Taiwan Application Serial No. 094119354, filed Jun. 10, 2005, the subject matter of which is incorporated herein by reference.

BACKGROUND OF THE INVENTION (1) Field of the Invention

The invention relates to a dual emitting device with an organic electroluminescent structure.

(2) Description of the Prior Art

As more and more various electric products come out, the function of a dual display becomes a main feature of the modern electric products. For example, the dual emitting device installed in a mobile phone can display a main function menu at one side, and display time at the other side. A conventional dual emitting device usually includes two adhered single-side panels, such as a liquid crystal panel adhered to an organic electro-luminescent panel, two adhered liquid crystal panels, or two adhered organic electro-luminescent panels.

FIG. 1 shows a conventional dual emitting device. The conventional dual emitting device 10 includes a first display panel 11 and a second display panel 12. The first display panel 11 has a transparent substrate 111, a first electrode 112, an emission layer 113, a second electrode 114 and a package lid 115. The emission layer 113 is disposed between the first electrode 112 and the second electrode 114. The first electrode 112 is formed on the transparent substrate 111. The package lid 115 is adhered on the transparent panel 111. The second display panel 12 has a transparent substrate 121, a third electrode 122, an emission layer 123, a forth electrode 124 and a package lid 125. The emission layer 123 is disposed between the third electrode 122 and the forth electrode 124. The third electrode 122 is formed on the transparent panel 121. The package lid 125 is adhered on the transparent substrate 121. The package lid 115 is adhered to the package lid 125 to construct the dual emitting device 10.

As stated above, the conventional dual emitting device 10 has two package lids 115 and 125, and two transparent substrates 111 and 121. Therefore, it becomes larger, thicker, and heavier, so as not to meet the requirement of weight, thickness and size. Besides, the two display panels 11 and 12 are respectively manufactured in two different processes. Therefore, the manufacture of the conventional dual emitting device 10 is complicated and time-consuming. Another drawback is that the two display panels 11 and 12 need to be driven independently.

It is difficult to reduce the thickness of the conventional dual emitting device because of the complicated manufacturing process and more package lids and substrates. Therefore, it is desirable to provide an organic electro-luminescent panel and manufacturing process thereof to avoid above disadvantages associated with conventional dual emitting devices.

SUMMARY OF THE INVENTION

Accordingly, the object of the present invention is to provide a dual emitting device through a simplified process by reducing the number of the package lids and the substrates, and to provide a method for manufacturing a thinner dual emitting device.

According to one aspect of the present invention, the dual emitting device comprises a transparent substrate and an array of pixels. The array of pixels is disposed on the transparent substrate, and each of the pixels includes at least one first sub-pixel and at least one second sub-pixel. The first sub-pixel comprises a first organic light emitting diode (OLED) driven by a first thin film transistor (TFT), and has a first sheltering layer adhered on the first OLED. The second sub-pixel includes the second OLED driven by the second TFT, and has a second sheltering layer formed between the transparent substrate and the second OLED. Therefore, the first OLED receives a first electrical signal to display a first image in a first emitting direction while the second OLED receives a second electrical signal to display a second image in a second emitting direction.

According to another aspect of the present invention, the method for manufacturing a dual emitting device comprises providing a transparent substrate; defining a first area and a second area on the transparent substrate; forming a transistor on the transparent substrate in each of the first area and the second area; forming a photoresist layer on the transparent substrate in the first area; forming a sheltering layer on the transparent substrate in the second area; forming an organic light emitting diode on the photoresist layer in the first area, and the other organic light emitting diode on the transparent substrate in the second area; and adhering a sheltering screen on the organic light emitting diode in the first area.

The dual emitting device of the present invention uses a white OLED as a main light source. The material of the transparent electrode includes thin metal, metal oxide or semiconductor, etc. The sub-pixels emitting in different direction are driven by different TFTs. In order to avoid the first image and the second image interfering with each other, a sheltering layer is adhered on the first OLED to cooperate with the photoresist layer to control the area and the light color in the first emitting direction. The area and the light color in the second emitting direction can be controlled by a black matrix formed by, for example, lithography, deposition and etching between the transparent substrate and the second OLED, and by a color filter adhering outside the dual emitting device. The pattern of the color filter is determined in accordance with different design requirements to filter out some light and to intercept other light.

According to a preferred embodiment of the present invention, the sheltering layer is formed in a part of the sub-pixel and under the light source. The sheltering layer cooperates with the pattern on the color filter to make the dual emitting device thinner and to simplify the manufacturing process. One advantage is that it needs only one substrate to construct a dual display equivalent to two display panels. The pixels for two light emitting surfaces are driven independently. This implies that two side of the dual emitting device can display different images at the same time through mono-color, multi-color such as red-green-blue (RGB) or red-green-blue-white (RGBW). The other advantage is that the evaporation process is simplified because the shadow mask is unnecessary to be controlled with high precision.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1:
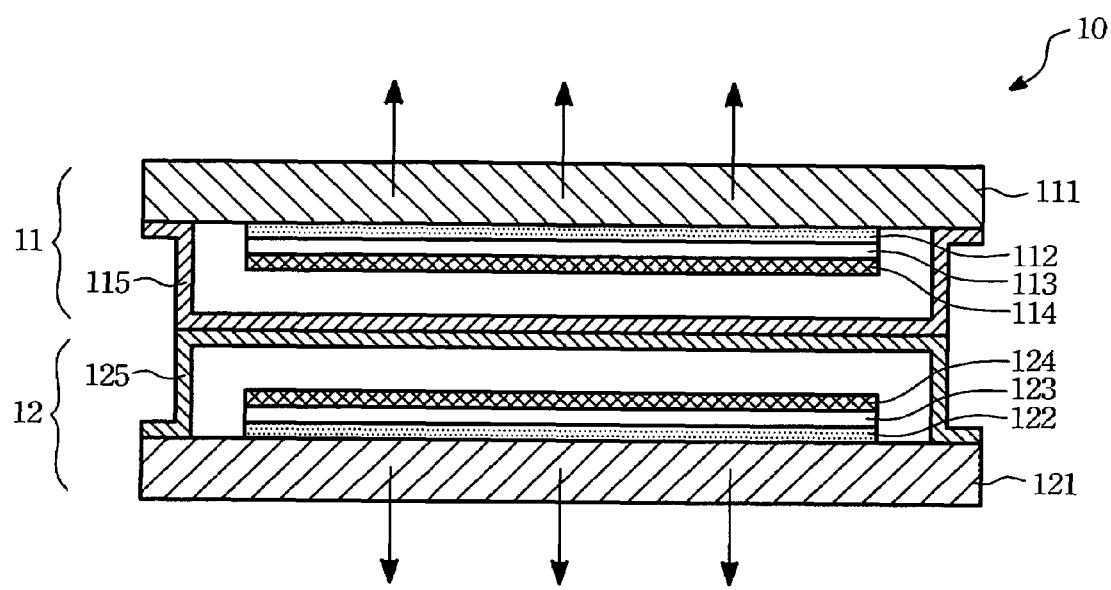
FIG. 1 is a dual emitting device according to the related art.
Figure 2:
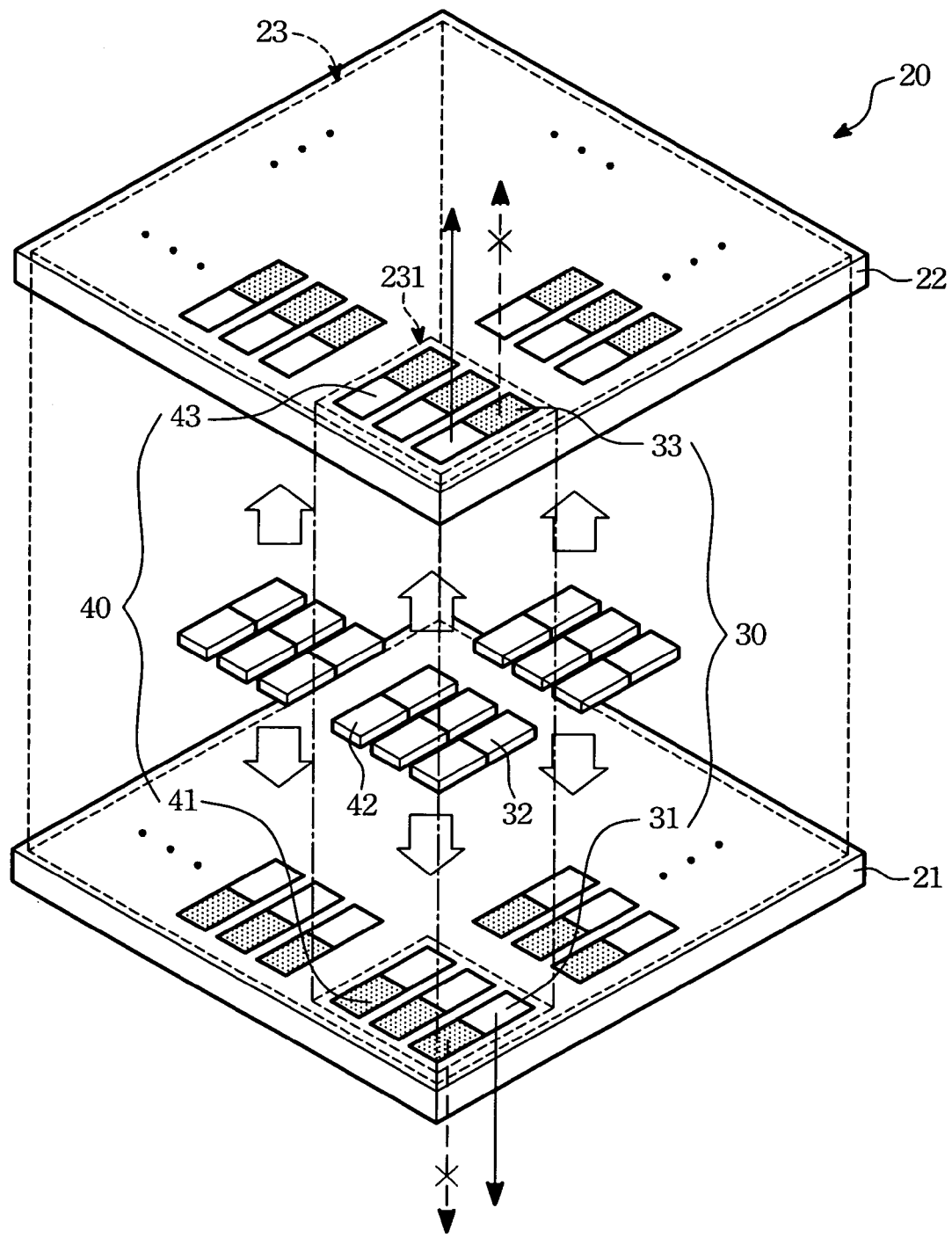
FIG. 2 is a dual emitting device according to the present invention.

FIG. 2 shows the dual emitting device of the present invention. The dual emitting device 20 includes a transparent substrate 21, a color filter substrate 22 and a pixel array 23 having a plurality of pixels 231 formed thereon. The pixel array 23 is disposed on the transparent substrate 21. Each of pixels 231 includes at least one first sub-pixel 30 and at least one second sub-pixel 40. The first sub-pixel 30 has a light transmitting structure 31 and a first OLED 32 driven by a first TFT (not shown). The light transmitting structure 31 is formed on the transparent substrate 21. The first OLED 32 is formed on the transmitting structure 31. The second sub-pixel 40 has an opaque structure 41 and a second OLED 42 driven by a second TFT (not shown). The opaque structure 41 is formed on the transparent substrate 21. The second OLED 42 is formed on the opaque structure 41. The color filter substrate 22 is adhered on the first OLED 32 and the second OLED 42.

The pattern of the color filter substrate 22 is composed of a sheltering layer 33 and a color filter 43. When the color filter substrate 22 is adhered on the first OLED 32 and the second OLED 42, the sheltering layer 33 is located on the first OLED 32 to shelter the light from the first OLED 32, and the color filter 43 is located on the second OLED 42 to filter the light from the second OLED 42. As shown in arrows, the light emitted from the first OLED 32 goes only through the transparent substrate 21, and the light emitted from the second OLED 42 goes only through the color filter substrate 22. Note that the color filter 43 is not required according to the present invention. Even if lacking the color filter 43 covering on the second OLED 42, the light can still emit out to achieve the effect of a dual display.

Based on the above-mentioned structure, when the first sub-pixel 30 receives a first electrical signal, it displays a first image in the first emitting direction. And when the second sub-pixel receives a second electrical signal, it displays a second image in a second emitting direction. The display time of the first image and the second image can be independently controlled, for instance, displaying at roughly the same time.

Figure 3A:
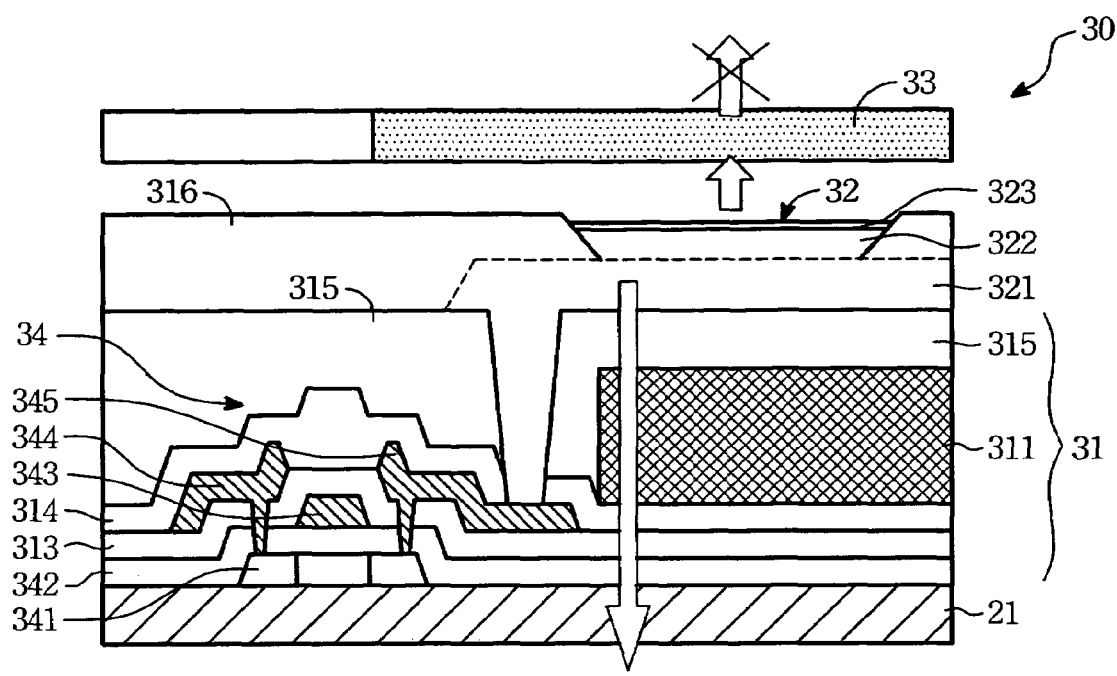
FIG. 3A is a first sub-pixel of the dual emitting device according to the present invention.

FIG. 3A shows the structure of the first sub-pixel 30 in the dual emitting device according to the present invention. The first sub-pixel 30 includes the light transmitting structure 31, the first OLED 32, and a first TFT 34. The first TFT 34 has a semiconductor layer 341, a gate insulating layer 342, a gate electrode 343, a source electrode 344 and a drain electrode 345. The semiconductor layer 341 is made of amorphous Si or poly-Si, and has contact areas with heavy doping, such as a p-type dopant or an n-type dopant, so as to contact with the source electrode 344 and the drain electrode 345. The semiconductor layer 341 is separated from the gate electrode 343 by the gate insulating layer 342 which is usually an oxide layer. The gate electrode 342 is separated from the source electrode 344 and the drain electrode 345 by an inner layer dielectric (ILD) 313. A first passivation layer 314 including a insulating material, such as SiN or SiOx, is formed on source electrode 344 and drain electrode 345. For driving the first OLED 32, the first passivation layer 314 has a hole to provide the drain electrode 345 to contact with a transparent electrode 321 of the first OLED 32.

The light transmitting structure 31 is located at the side of the first TFT 34, and under the first OLED 32, and includes a photoresist layer 311 formed between the transparent substrate 21 and the first OLED 32. The photoresist layer 311 can be formed on the upper surface of the transparent substrate 21 immediately. In addition, the gate insulating layer 342, the inner layer dielectric 313, the first passivation layer 314 are formed on entire transparent substrate 21 in the TFT manufacturing process, the photoresist layer 311 is usually formed on the extension port of the gate insulating layer 342, the inner layer dielectric 313, and the first passivation layer 314.

A second passivation layer 315 is formed on the light transmitting structure 31 and the first TFT 34 so as to provide a plane surface. The second passivation layer 315 has a hole to continue the hole of the first passivation 314. The transparent electrode 321 of the first OLED 32 is formed on the second passivation layer 315 and contacts with the drain electrode 345 through the hole of the second passivation layer 315 and of the first passivation 314. On the transparent electrode 321 are an organic electroluminescent structure 322 and the other transparent electrode 323. The cap layer 316 separates the first OLED 32 from the other OLEDs to avoid light leakage or leakage current and to protect the first OLED 32. As shown in FIG. 3A, the first sub-pixel 30 further includes a sheltering layer 33 adhered on the first OLED 32 to intercept the upward light.

Figure 3B:
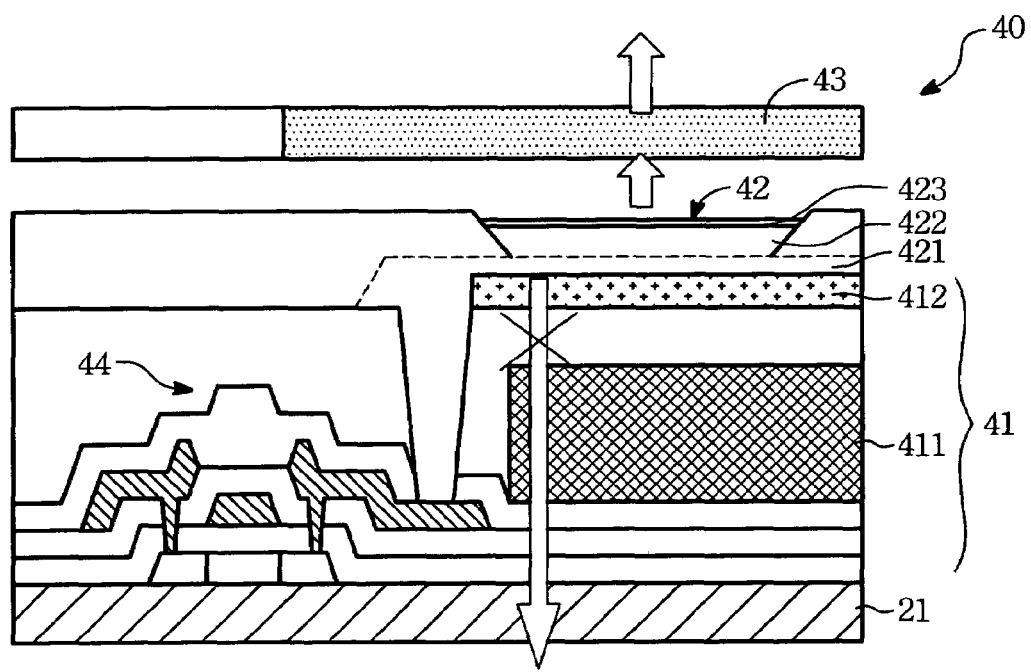
FIG. 3B is a second sub-pixel of the dual emitting device according to the present invention.

FIG. 3B shows the second sub-pixel 40 of the dual emitting device. The second sub-pixel 40 includes the opaque structure 41, the second OLED 42 and a second TFT 44. The second TFT 44 is used to drive the second OLED 42, and is similar in structure to the first TFT 32. Comparing with the first sub-pixel 30, the second sub-pixel 40 further includes a sheltering layer 412 formed between the transparent substrate 21 and the second OLED 42, and has a color filter 43 adhered on the second OLED 42. The sheltering layers 33 and 412 include a black photoresist material, a reflective material, an opaque metal, and a metal oxide layer.

The photoresist layer and color filter in the first sub-pixel 30 or the second sub-pixel 40 can be red, green, blue or transparent in color, and also can be roughly the same color. The material of the transparent electrodes of the first OLED 32 and of the second OLED 42 can be ITO or IZO. According to the present invention, it is unnecessary to limit the light color of the OLED. For producing different color sub-pixels, the white OLED can cooperate with red, green and blue photoresist layers or the color filter. Alternatively, red, green and blue OLEDs can cooperate with the transparent photoresist layer or the color filter. Moreover, after using the white OLED, the step of forming red, green and blue sub-pixels by evaporating different dyes can be left out to simplify the process.

Figure 3C:
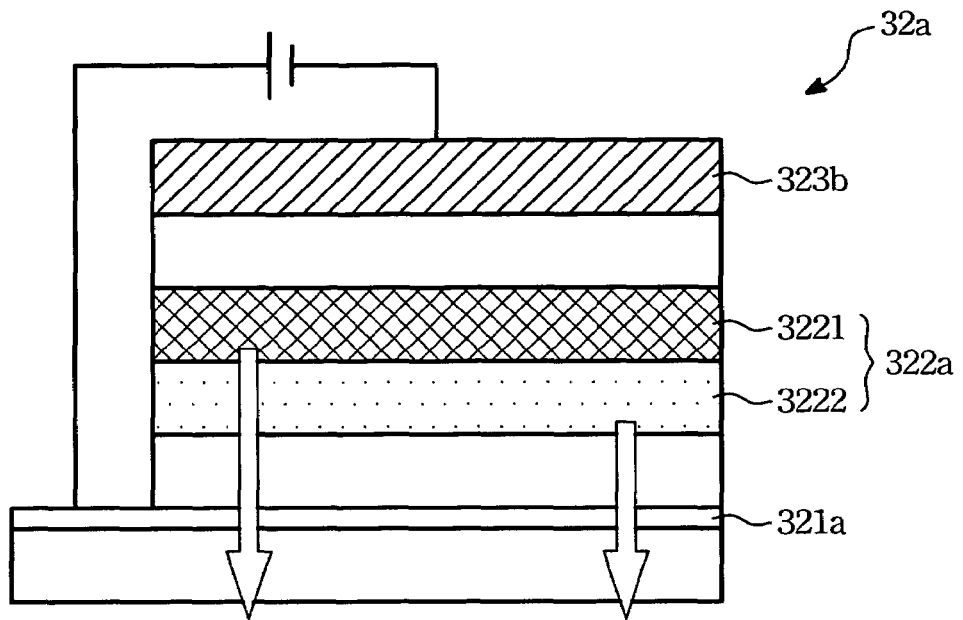
FIGS. 3C-3D show two types of white OLEDs according to the present invention.
Figure 3D:
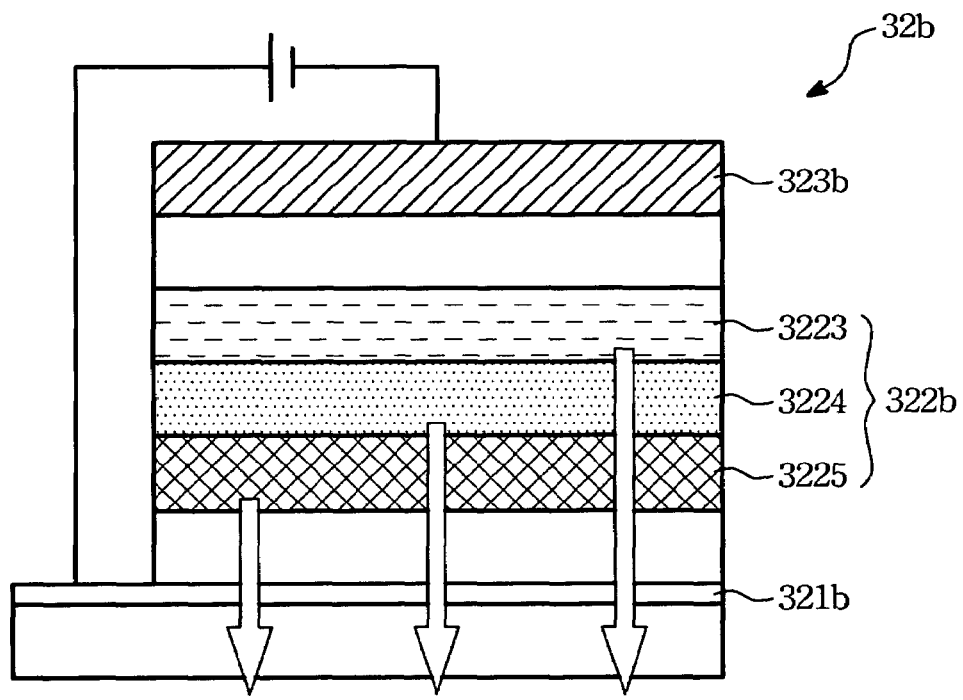

FIGS. 3C-3D show two types of the white OLED. Regarding the first OLED 32, choosing a blue emission layer 3221 to stack with a color conversion material 3222 can generate white light. The color conversion material 3222 can be doped with a yellow fluorescent material. Another method for generating white light is to provide a red emission layer 3223, a green emission layer 3224, and a blue emission layer 3225 stacked with each other. Similarly, the second OLED 42 can be manufactured by the same way. Usually, the organic electroluminescent structure 322a and 322b include an electron injection layer, an electron transport layer, a hole injection layer or a hole transport layer and so on.

To sum up, the dual emitting device according to the present invention uses the transparent electrode which includes the thin metal, the metal oxide or the semiconductor, as the electrode of the OLEDs. The OLEDs in upward light emitting area and in downward light-emitting area are driven independently by different TFTs. The size of the light emitting areas and light color are controlled by the photoresist layer or the sheltering layer, and by external color filter. The photoresist layer or the sheltering layer, such as a black matrix, is formed on the substrate by lithography, deposition and etching, for example. The pattern of the color filter is determined in accordance with different design requirements to filter some light and to intercept other light.

FIGS. 4A-4E show the manufacturing method of the dual emitting device according to the present invention. The method comprises: providing the transparent substrate 21, and defining a first area 21a and a second area 21b on the transparent substrate 21; subsequently, forming the TFT 34 and 44 in the first area 21b and the second area 21b on the transparent substrate 21; and, forming the photoresist layer 311 in the first area 21a on the transparent substrate 21, and forming the sheltering layer 412 in the second area 21b on the transparent substrate 21; after that, forming the OLED 32 (as shown in FIG. 3A) on the photoresist layer 311 in the first area 21a and on the transparent substrate 21 in the second area 21b; and then, adhering the sheltering screen 33a on the OLED 42 in the first area 21a. The detail is stated as follows.

Figure 4A:
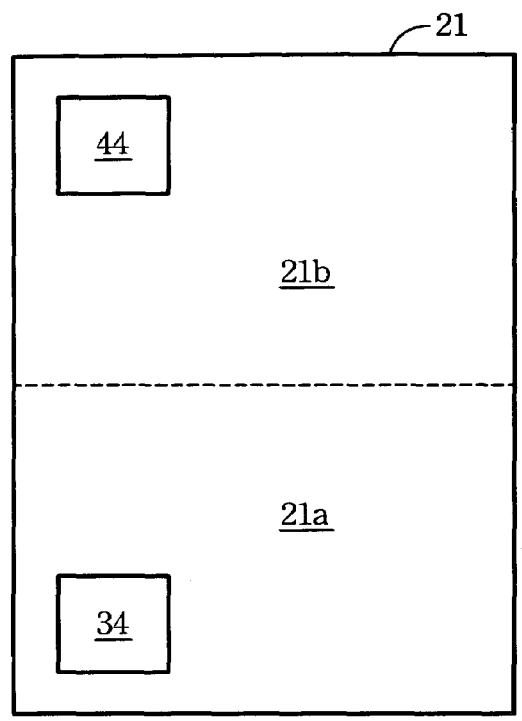
FIGS. 4A-4E show the method for manufacturing a dual emitting device according to the present invention.

Referring to FIG. 4A, after the transparent substrate 21, such as a glass substrate, is treated with cleaning and doping, a plurality of sub-pixel areas are defined on it. Each of the sub-pixels is divided into a first area 21a and a second area 21b. Next, a TFT manufacturing process is performed to form the first TFT 34 and the second TFT 44 in the first area 21a and the second area 21b.

Figure 4B:
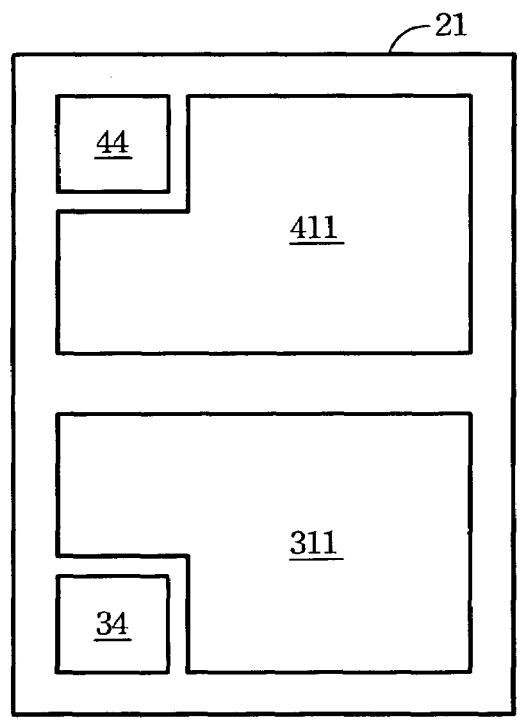

FIG. 4B shows the photoresist layer 311 formed in the first area 21a, and the photoresist layer 411 formed in the second area 21b. Note that the photoresist layer 411 is an optional element in the present invention. For forming a plane structure, the photoresist layer 411 is formed at the same step of forming the photoresist layer 311. Because the gate insulating layer 342, the inner layer dielectric 313 and the first passivation layer 314 may be formed on the transparent substrate 21 in the previous process, the gate insulating layer 342, the inner layer dielectric 313 and the first passivation layer 314 and so forth can be provided between the photoresist layer 311, 411 and the transparent substrate 21.

Figure 4C:
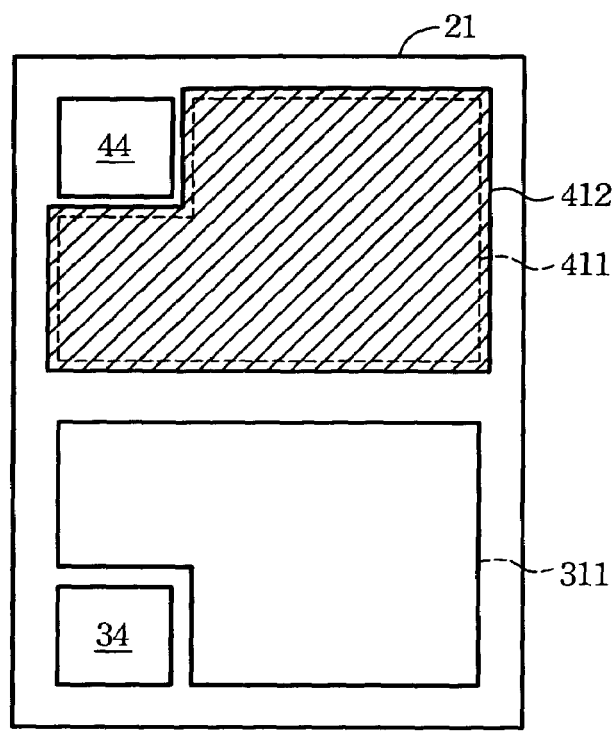

Referring to FIG. 4C, the sheltering layer 412 is formed on the photoresist layer 411 in the second area 21b by, for example, depositing the black photoresist material, the reflective materials, the opaque metals and the metal oxide.

Subsequently, the first OLED 32 is formed on the photoresist layer 311, and the second OLED 42 is formed on the sheltering layer 412. Referring to FIG. 4G, the two electrodes and the emission layers of the OLEDs are formed by evaporation, for example. To simplify the process, one OLED is formed on the entire surface of the structure shown in FIG. 4C. A part of the OLED located in the first area 21a is defined as the first OLED 32, and the other part of the OLED located in the second area 21b is defined as the second OLED 42. Preferably, before forming the OLED on the entire substrate, a plane second passivation layer 315 is formed. After forming the OLED, it is patterned to divide into a first OLED and a second OLED, and covered by the cap layer 316 for purpose of protection.

Referring to FIG. 3C again, when using the white OLED, the manufacturing method further includes: forming the first transparent electrode 321a on the photoresist layer in the first area 21a, and on the transparent substrate 21 in the second area 21b; next forming the blue emission layer 3221 and the color conversion material 3222 stacking on the first transparent electrode 321a: and then forming the second transparent electrode 323a on the emission layers. Preferably, the color conversion material 3222 is doped with a yellow fluorescent material. Referring to FIG. 3D, another manufacturing method includes: forming the first transparent electrode 321b on the photoresist layer 311 in the first area 21a and on the transparent substrate 21 in the second area 21b; next forming the red emission layer 3223, the green emission layer 3224 and blue emission layer 3225 on the first transparent electrode 321b; and forming a second transparent electrode 323b on the emission layers.

Figure 4D:
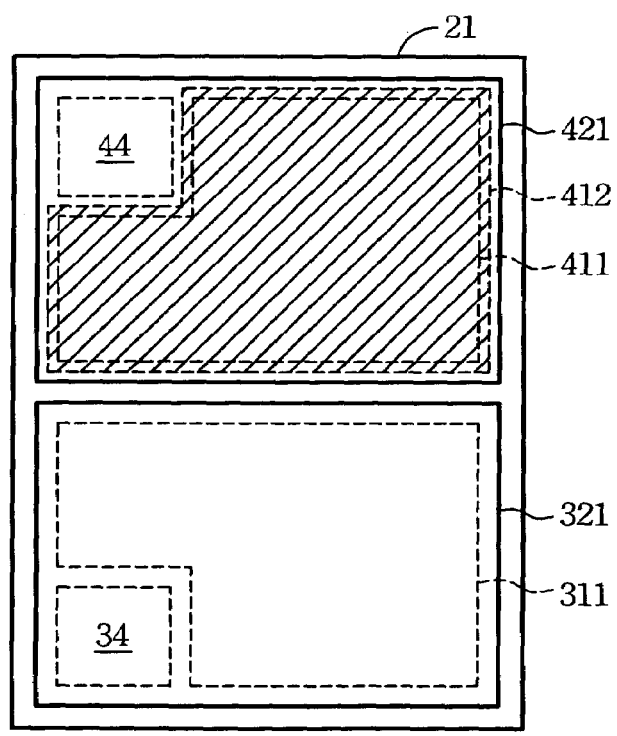
Figure 4E:
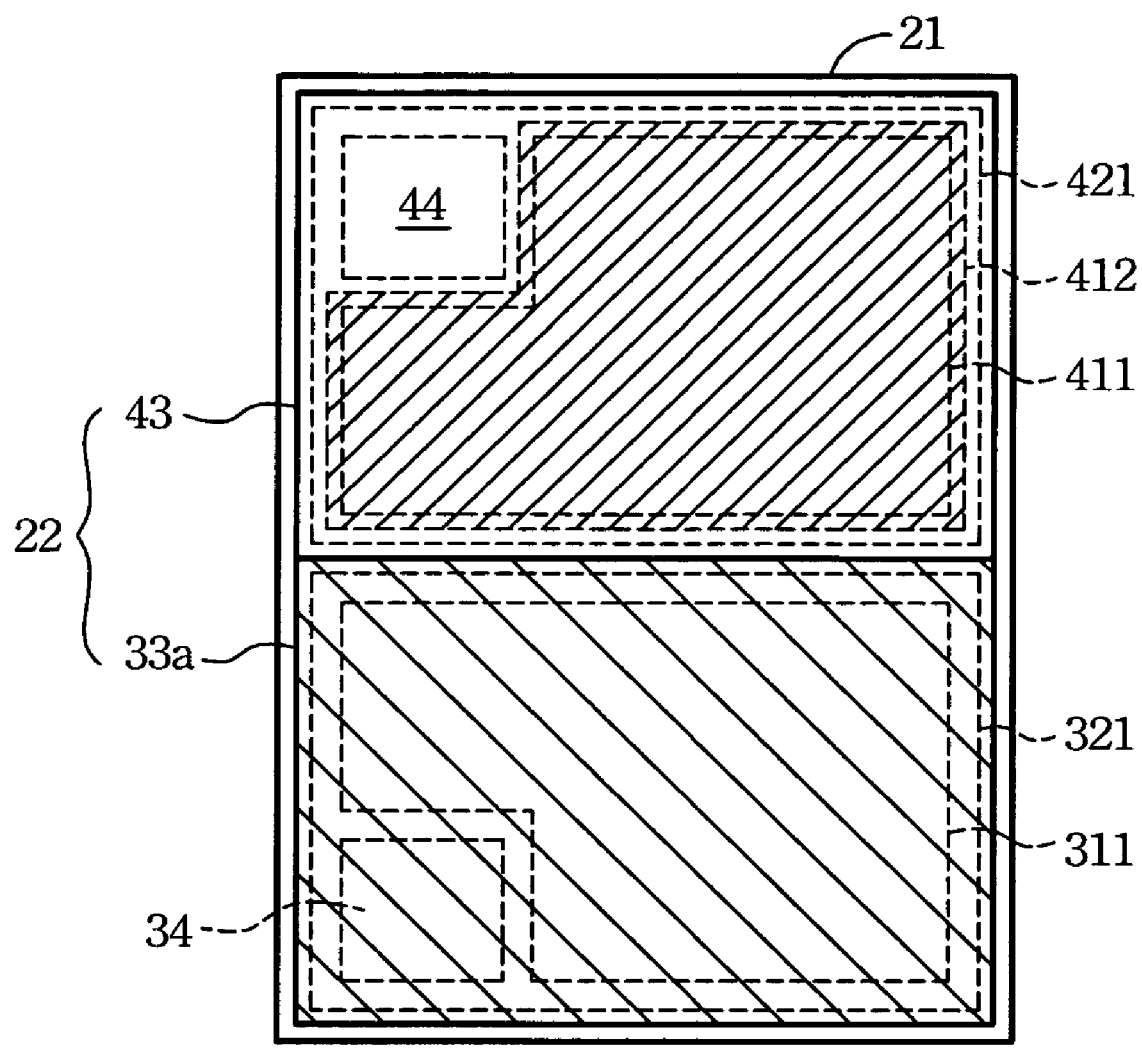

FIG. 4E shows that the color filter substrate 22 is adhered on the structure shown in FIG. 4D, and the sheltering screen 33a is aligned to adhere on the second OLED 42. After adhering the color filter substrate 22, it becomes a package lid to prevent damage that may be caused by moisture.

According to the present invention, there is provided two areas in a pixel where one emits light frontward and the other emits light backward. A front color display is actuated by a TFT cooperating with the external color filter. A back color display is actuated by another TFT cooperating with the photoresist layer. The way for front emitting or back emitting includes mono-color, RGB, RGBW or a combination thereof. The OLED is not only to emit white light, but also to emit red, green, blue light or a combination thereof. Comparing with the related art, the present invention provides only one substrate to construct the dual display equivalent to two display panels. The pixels for two light emitting surfaces are driven independently so that two light emitting surfaces of the dual emitting device can display different images at the same time. The evaporation process is simplified because it is unnecessary to control the shadow mask with high precision.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A dual emitting device, comprising:
    a transparent substrate;
    an array of pixels, disposed on the transparent substrate, each of the pixels including at least one first sub-pixel and at least one second sub-pixel, wherein the first sub-pixel includes a first organic light emitting diode driven by a first thin film transistor, and the second sub-pixel includes a second organic light emitting diode driven by a second thin film transistor;
    a first sheltering layer adhered on the first organic light emitting diode;
    a second sheltering layer formed between the transparent substrate and the second organic light emitting diode; and
    a photoresist layer formed in between the transparent substrate and the organic light emitting diode, the photoresist being provided as a planarization layer in whole areas and an extra function of a color filter in a region of the first sub-pixel.

2. The dual emitting device of claim 1, further comprising a color filter adhered on the second organic light emitting diode.

3. The dual emitting device of claim 1, wherein the first organic light emitting diode and the second organic light emitting diode include a red emission layer, a green emission layer, and a blue emission layer stacked with each other.

4. The dual emitting device of claim 1, wherein the first organic light emitting diode comprises a white organic light emitting diode.

5. The dual emitting device of claim 1, wherein the second organic light emitting diode comprises a white organic light emitting diode.

6. The dual emitting device of claim 1, wherein the first sheltering layer includes a black photoresist material.

7. The dual emitting device of claim 1, wherein the first sheltering layer includes a reflective material.

8. The dual emitting device of claim 1, wherein the first sheltering layer includes an opaque material.

9. The dual emitting device of claim 1, wherein the first sheltering layer includes a metal oxide.

10. The dual emitting device of claim 1, wherein the second sheltering layer includes a black photoresist material.

11. The dual emitting device of claim 1, wherein the second sheltering layer includes a reflective material.

12. The dual emitting device of claim 1, wherein the second sheltering layer includes an opaque metal.

13. The dual emitting device of claim 1, wherein the second sheltering layer includes a metal oxide.

14. The dual emitting device of claim 1, wherein the first sub-pixel is adapted to receive a first electrical signal to display a first image in a first emitting direction, and the second sub-pixel is adapted to receive a second electrical signal to display a second image in a second emitting direction.

15. The dual emitting device of claim 14, wherein the first image and the second image are displayed at about the same time.

16. The dual emitting device of claim 1, wherein the photoresist layer and the color filter include a color selected from the group consisting of red, green, blue and transparent.

17. The dual emitting device of claim 1, wherein the photoresist layer and the color filter are substantially the same color.

18. The dual emitting device of claim 1, wherein each of the first organic light emitting diode and the second organic light emitting diode has two electrodes.

19. The dual emitting device of claim 18, wherein the transparent electrodes are IZO, ITO, AZO, or transparent semiconductors.

20. The dual emitting device of claim 1, wherein the first organic light emitting diode and the second organic light emitting diode include a blue emission layer and a color conversion material stacked with each other.

21. The dual emitting device of claim 20, wherein the color conversion material includes a yellow fluorescent material.

* * * * *